United States Patent
Ehls et al.

(10) Patent No.: US 7,106,052 B2
(45) Date of Patent: Sep. 12, 2006

(54) INDUCTIVE PROXIMITY SWITCH WITH DIFFERENTIAL COIL ARRANGEMENT

(75) Inventors: Stefan Ehls, Hagen (DE); Jens Müller, Radevormwald (DE)

(73) Assignee: Werner Turck GmbH & Co. KG, Halver (DE)

( * ) Notice: Subject to any disclaimer, the term of this patent is extended or adjusted under 35 U.S.C. 154(b) by 49 days.

(21) Appl. No.: 10/970,234

(22) Filed: Oct. 18, 2004

(65) Prior Publication Data

US 2005/0184814 A1  Aug. 25, 2005

(30) Foreign Application Priority Data

Oct. 20, 2003  (DE) ............... 103 48 599
Oct. 30, 2003  (DE) ............... 103 50 733

(51) Int. Cl.
*G01B 7/14* (2006.01)
*G01R 33/02* (2006.01)

(52) U.S. Cl. ............. 324/207.12; 324/207.18; 324/207.26

(58) Field of Classification Search ......... 324/207.12, 324/207.18, 207.26
See application file for complete search history.

(56) References Cited

U.S. PATENT DOCUMENTS 6,545,464 B1 * 4/2003 Tigges et al. ........ 324/207.26

2002/0070729 A1 * 6/2002 Muller ............... 324/207.26

FOREIGN PATENT DOCUMENTS

| DE | 32 44 449 A 1 | | 8/1983 |
| DE | 3934593 | * | 4/1991 |
| DE | 4031252 | | 10/1991 |
| DE | 19740774 | | 3/1998 |
| DE | 19850749 | | 3/2000 |
| DE | 100 03 913 A 1 | | 10/2001 |
| DE | 100 39 519 A 1 | | 2/2002 |
| DE | 10039610 | | 2/2002 |
| DE | 10057773 | | 5/2002 |
| EP | 0304272 | * | 2/1989 |
| JP | 61086647 | * | 5/1986 |

* cited by examiner

*Primary Examiner*—Reena Aurora
(74) *Attorney, Agent, or Firm*—Martin A. Farber

(57) ABSTRACT

Inductive proximity switch has a first transmitting coil (S1) and a first receiving coil (E1) of a receiving coil arrangement. The transmitting coil (S1) transmits an exciting field inducing eddy currents in a metallic trip (1) brought into the vicinity of the proximity switch. The eddy currents generate a voltage-inducing eddy current field in the first coil (E1) of the receiving coil arrangement. The first coil E1 and a second coil (E2) of the receiving coil arrangement are disposed and connected so that the exciting field generates a differential voltage (3), in the receiving coil arrangement. A pair of compensating coils includes the second coil (E2) of the receiving coil arrangement and a compensating coil (S2) connected in series with the transmitting coil (S1), the pair of compensating coils being isolated from the eddy current field.

15 Claims, 4 Drawing Sheets

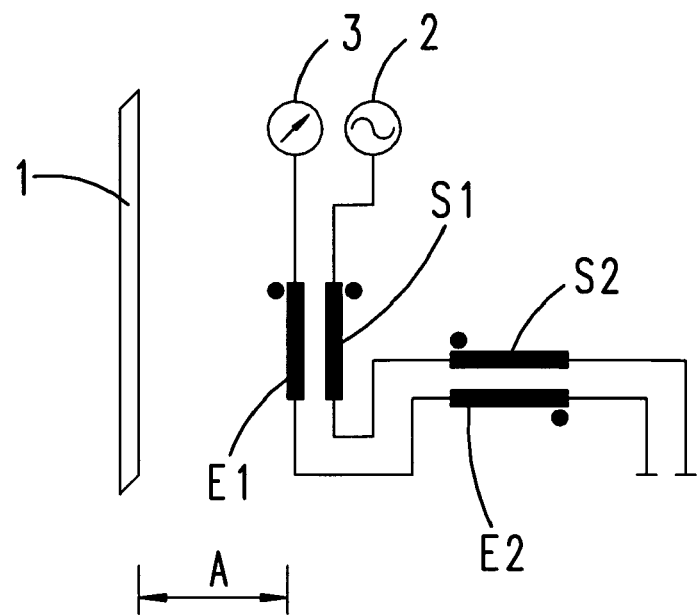
*Fig·1*
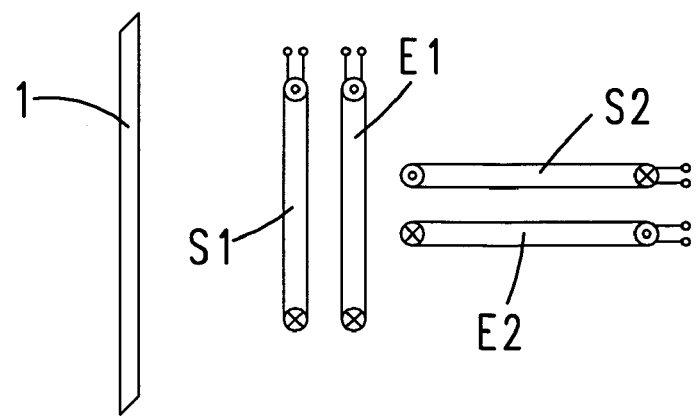
*Fig·2*

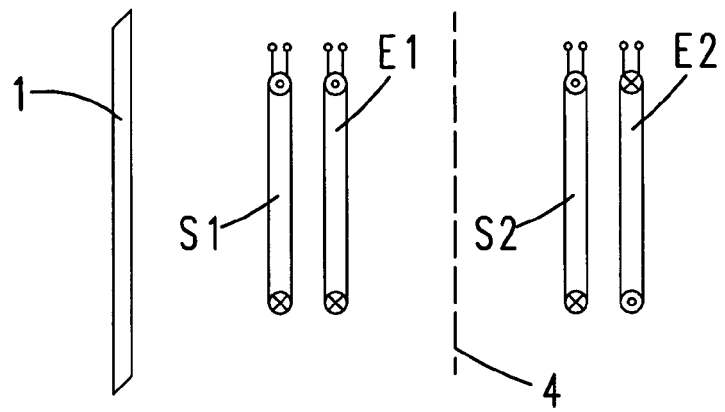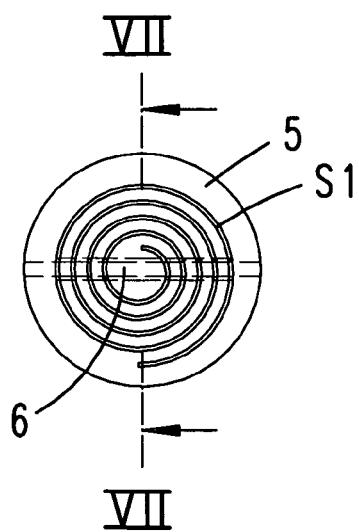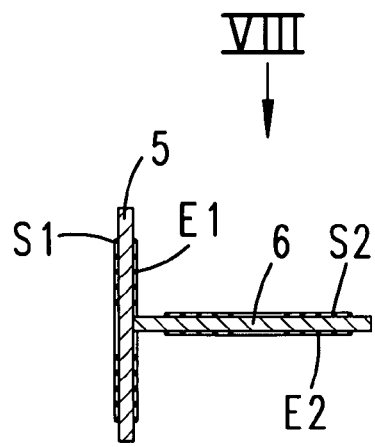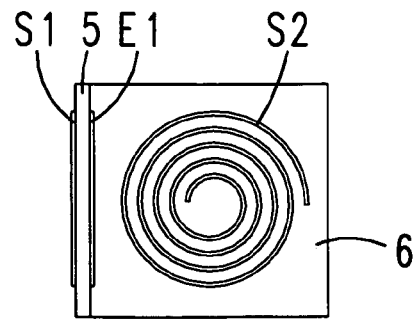

INDUCTIVE PROXIMITY SWITCH WITH DIFFERENTIAL COIL ARRANGEMENT

FIELD AND BACKGROUND OF THE INVENTION

The invention relates to an inductive proximity switch.

A proximity switch is already known from DE 19 740 774 A1. Described there is an inductive proximity switch with two transmitting coils and two receiving coils, the transmitting coil and the receiving coils being respectively disposed parallel to one another. The mode of operation of the proximity switch described there is based on the two receiving coils being influenced alternating electromagnetic fields which pass through and are generated by a trip.

A further proximity switch is already known from DE 40 31 252 C1. This document describes a proximity switch in which each transmitting coil is acted upon by an oscillator with an alternating current. Right next to the transmitting coil there are two receiving coils, spaced slightly apart from one another, which are connected in series but wound in opposite directions. The position of the receiving coils is chosen such that, when the trip does not approach, an aggregate current close to zero is induced in the two differential coils.

If a metal trip approaches the transmitting coil, eddy currents are generated in the trip. These eddy currents generate an opposing field with respect to the exciting field. This opposing field has a different intensity in the two receiving coils. It consequently induces voltages of different magnitudes in the two receiving coils. The differential signal of these two voltages deviates from zero and can be amplified to form the output signal.

DE 100 39 610 relates to a proximity switch with an oscillating circuit in which two windings are provided, which by analogy with the proximity switches described above are likewise electromagnetically coupled to one another.

DE 198 50 749 is concerned with an inductive proximity switch operating two detector coils and a transmitting coil, in which the coils are formed as planar coils and likewise lie in the field generated by the induced eddy current field.

DE 100 57 773 discloses a proximity switch in which a multiplicity of coils are associated with a printed circuit board as planar coils lying next to one another.

On the basis of the prior art cited at the beginning, the object of the invention is to take measures which increase the switching distance.

SUMMARY OF THE INVENTION

The object is achieved by the invention specified in the claims.

The invention relates to an inductive proximity switch with a pair of transmitting coils, having a transmitting coil and a first coil of a receiving coil arrangement, the transmitting coil transmitting an exciting field, for inducing eddy currents in a metallic trip brought into the vicinity of the proximity switch, which eddy currents generate a voltage-inducing eddy current field in the first coil of the receiving coil arrangement, the coils of the receiving coil arrangement being disposed and connected in such a way that the exciting field generates a differential voltage there, and with a pair of compensating coils, having a second coil of the receiving coil arrangement and a compensating coil connected in series with the transmitting coil, the pair of compensating coils being disposed in such a way that they are virtually unable to be influenced by the eddy current.

It is consequently provided according to the invention that the second coil of the receiving coil arrangement is disposed together with the compensating coil in such a way that they are virtually unable to be influenced by the eddy current field. This can take place by the pair of coils being disposed at an angle, in particular a right angle, in relation to one another. It is possible as an alternative either to shield the pair of coils having the compensating coil or dispose them spatially away from the other pair of coils. It is preferably provided that the second coil of the receiving coil arrangement and the compensating coil are disposed close together coaxially in relation to one another.

Developments of the invention that also have an independent character are discussed hereafter. It is provided that the second coil of the receiving coil arrangement and the compensating coil are disposed close together coaxially in relation to one another. It may be provided that the transmitting coil and the first coil of the receiving coil arrangement have the same winding direction and the second coil of the receiving coil arrangement and the compensating coil have opposite winding directions or the transmitting coil and the first coil of the receiving coil arrangement have opposite winding directions and the second coil of the receiving coil arrangement and the compensating coil have the same winding direction. It may also be provided that the plane of the transmitting coil or the first coil of the receiving coil arrangement is at an angle greater than zero, preferably 90°, to the plane of the second receiving coil arrangement or the compensating coil. In a development it is provided that one of the two pairs of coils, the transmitting coil and the first coil of the receiving coil arrangement or the second coil of the receiving coil arrangement and the compensating coil, are formed as planar coils on a conductor track. In addition, it is provided that the two coils of a pair of coils are disposed on the two opposite sides of a printed circuit board. It is advantageous if the printed circuit board carrying the compensating coil is connected to the rear side of the printed circuit board carrying the transmitting coil. It may also be provided that the printed circuit board carrying the compensating coil is diametrically associated with the printed circuit board carrying the transmitting coil. It is also advantageous if the pair of coils comprising the second coil of the receiving coil arrangement and the compensating coil is disposed away from or shielded from the pair of coils comprising the transmitting coil and the first coil of the receiving coil arrangement. A development of the invention provides that the transmitting coil and the first coil of the receiving coil arrangement are connected to an oscillator oscillating with a fixed frequency and amplitude. It is also advantageous if the first coil of the receiving coil arrangement constitutes parts of an oscillator. Finally, it may be provided that the transmitting coil and the first coil of the receiving coil arrangement are parts of a self-oscillating oscillator which is damped when the trip approaches or begins to oscillate when the trip approaches. The transmitting coil and the compensating coil are connected in series. They are wound in the same direction. They are fed by an AC voltage generator. The two coils of the receiving coil arrangement are likewise connected in series but wound in opposite directions. The coils are tuned to one another in such a way that the differential voltage of the receiving coil arrangement is substantially zero if a trip is away. However, a small signal may be present. If a trip then approaches the transmitting coil, an eddy current is induced in the metal of the trip. This eddy current generates an eddy current field opposed to the exciting field. Since the second coil of the receiving coil arrangement is disposed in such a way that it remains virtually uninfluenced by the eddy current field, the differential voltage substantially comprises only the voltage that is induced by the eddy current field in the first coil of the receiving coil arrangement. In this case, it may be provided that this voltage reaches a threshold value whenever the distance of the trip from the transmitting coil corresponds to the switching distance. Since, because of the solution according to the invention, the output voltage of the receiving coil arrangement is virtually equal to the voltage which is induced in the first receiving coil by the eddy current field, the sensitivity of the entire circuit is increased in comparison with that of the prior art. Accordingly, greater switching distances are possible. However, it is also possible for the output voltage of the receiving coil arrangement to drop to zero or change its sign when the switching distance is reached. It is regarded as advantageous that the circuit is thermally very stable, since the two pairs of coils can be respectively associated with one printed circuit board. The two coils of each pair of coils can be produced on the broad sides facing away from one another of the printed circuit board by the customary coating/etching methods. The two printed circuit boards may be adhesively bonded to one another. For this purpose, the printed circuit board carrying the compensating coil is adhesively attached with its narrow side in particular diametrically onto the rear side of the printed circuit board carrying the transmitting coil. If the two planes of the pairs of coils are perpendicular to one another, the two pairs of coils can be disposed in direct proximity. The lines of flux of the eddy current field thereby pass substantially through only the winding of the transmitting coil or the first coil of the receiving coil arrangement. The two other coils are effectively not passed through by the lines of flux of the eddy current field. In an alternative configuration, it is provided that the pair of coils having the compensating coil is disposed away from the pair of coils having the transmitting coil. In the case of this alternative, the effect that the compensating coil is virtually uninfluenced by the eddy current field is achieved by the spatial distancing alone. This variant is advantageous in particular in the case of proximity switches with a small coil diameter. For example, it is possible in the case of a tubular proximity switch of a diameter between 10 and 15 mm to dispose the pair of transmitting coils in the front region of the sensor and the pair of compensating coils at the other end of the tube. In this case, the two pairs of coils are spaced apart from one another in such a way that the pair of compensating coils is virtually uninfluenced by the eddy current field.

As an alternative to this, the pair of coils having the compensating coil may also be shielded with respect to the eddy current field by suitable measures.

BRIEF DESCRIPTION OF THE DRAWINGS

Exemplary embodiments of the invention are explained below with reference to accompanying drawings, in which:

FIG. 1 shows the basic principle of the circuit according to the invention,

FIG. 2 shows a first variant of the arrangement of the two pairs of coils,

FIG. 5 shows a further variant of the arrangement of the two pairs of coils, FIG. 6 shows in a view from the front of an exemplary embodiment in which the two pairs of coils are each disposed on a printed circuit board and the two printed circuit boards are adhesively bonded to one another, FIG. 7 shows a representation according to the sectional line VII—VII in FIG. 6, FIG. 8 shows a view in the direction of the arrow VIII in FIG. 7.

DETAILED DESCRIPTION OF THE PREFERRED EMBODIMENT(S)

Figure 3:
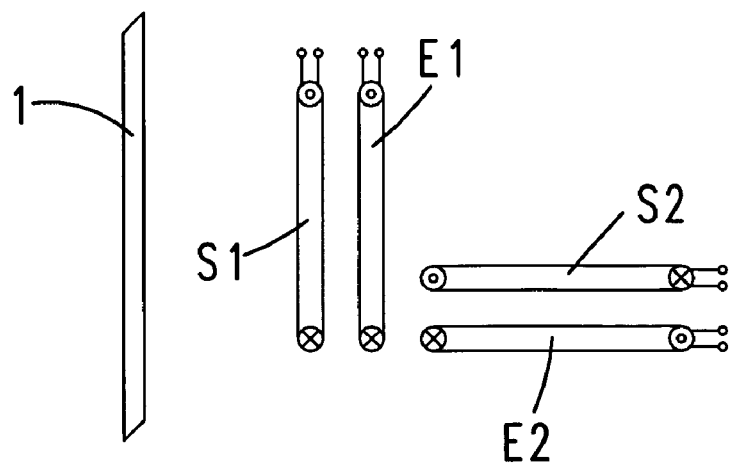
FIG. 3 shows a second variant of the arrangement of the two pairs of coil.

The basic principle represented in FIG. 1 shows the two pairs of coils. A first pair of coils is formed by the transmitting coil S1 and the receiving coil E1. These two coils are disposed coaxially in relation to one another and have the same winding direction. Provided functionally at a distance from this first pair of coils is a second pair of coils, which comprises the compensating coil S2, which is connected in series with the transmitting coil S1, and the second coil E2 of the receiving coil arrangement, which is connected in series with the first coil E1 of the receiving coil arrangement. The compensating coil S2 and the second coil E2 of the receiving coil arrangement likewise lie on one another and are disposed coaxially in relation to one another, but the two coils are wound oppositely. The transmitting coil arrangement comprising the two coils S1 and S2 is connected to a generator 2. This generator 2 feeds the two coils S1 and S2 with an AC voltage. The exciting field emitted by the transmitting coil S1 generates eddy currents in a metallic trip 1, which approaches the transmitting coil S1. These eddy currents generate an opposing field with respect to the exciting field. This eddy current field is superposed in the receiving coil E1 with the exciting field generated by the transmitting coil S1. As a result of the opposed directions of the two fields, the effective magnetic field that is present in the receiving coil E1 is weakened. This has the consequence that a somewhat lower voltage is induced in the receiving coil E1.

A magnetic field is generated by the second transmitting coil S2, which has previously been referred to as the compensating coil. This magnetic field induces a voltage in the second receiving coil E2. The two receiving coils E1 and E2 are tuned to the two transmitting coils S1 and S2 in such a way that the differential output signal is precisely zero when the trip 1 is away. This is achieved by the two windings having the same winding direction in the case of one of the two pairs of coils (for example S1, E1) and the two coils being oppositely wound in the case of the other pair of coils (for example S2, E2).

The pair of coils having the compensating coil S2 is disposed in such a way that it is virtually uninfluenced by the eddy current field. This has the consequence that the differential output signal 3 does not have a reducing component as in the case of the prior art, but substantially comprises the induction component which the eddy current field generates.

In the case of the configurational variant represented in FIG. 2, the two coils S1 and E1 of the first pair of coils are virtually the same size. The two coils of S2, E2 of the second pair of coils are also approximately the same size. However, the two pairs of coils lie in planes that are perpendicular to one another. The pair of coils having the transmitting coil S1 is disposed in such a way that the axis of the coil corresponds to the axis of approach of the trip 1. The axis of the second pair of coils is perpendicular to this axis.

Figure 4:
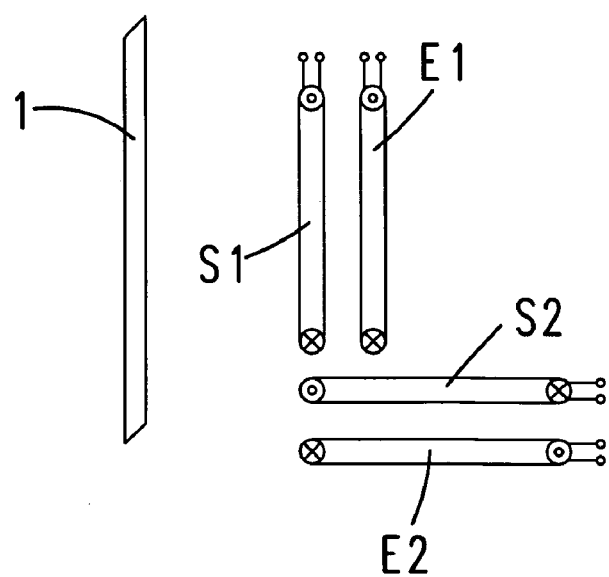
FIG. 4 shows a further variant of the arrangement of the two pairs of coil.

It is also the case in the exemplary embodiments represented in FIGS. 3 and 4 that the axis of the pair of coils having the compensating coil S2 and the second receiving coil E2 is perpendicular to the axis of the first pair of coils. While in the exemplary embodiment represented in FIG. 2 the center plane of the pair of coils having the compensating coil S2 is disposed diametrically to the transmitting coil S1, it is the case in the exemplary embodiment represented in FIG. 3 that the center plane of the pair of coils having the compensating coil S2 is offset toward the edge. In the exemplary embodiment represented in FIG. 4, the center plane of the pair of coils having the compensating coil S2 is even offset to outside the coil area of the transmitting coil 1.

In the exemplary embodiment represented in FIG. 5, the two pairs of coils are away from one another to the extent that the eddy current field only induces a small voltage in the receiving coil E2 when the switching distance is reached. An optional shielding between the two pairs of coils is designated by the reference numeral 4. With this shielding, the two pairs of coils can be disposed closer to one another. Unlike in the case of the exemplary embodiment represented in FIGS. 2, 3 and 4, here the axes of the two pairs of coils lie parallel to one another.

In the exemplary embodiment represented in FIGS. 6 to 8, the two transmitting coils S1 and S2 and the two receiving coils E1 and E2 are formed in each case as planar coils on a conductor track 5, 6. The transmitting coil S1 in this case lies on one side of the printed circuit board 5. The receiving coil E1 lies on the rear side of the same printed circuit board 5. Both coils have a spiral form and are etched out from a continuous copper coating. In a variant not represented, the transmitting coil S1 and the receiving coil E1 are located on the same side of the printed circuit board.

The compensating coil S2 and the receiving coil E2 are also associated with a common printed circuit board 6. In the exemplary embodiment, the two coils S2, E2 lie on the two broad sides facing away from one another of the printed circuit board 6. Here, too, it is possible to dispose the two coils S2, E2 on the same side of the printed circuit board. The two printed circuit boards are adhesively bonded to one another. In this case, the narrow side of the printed circuit board 6 is adhesively attached diametrically onto the broad side of the printed circuit board 5.

Figure 9:
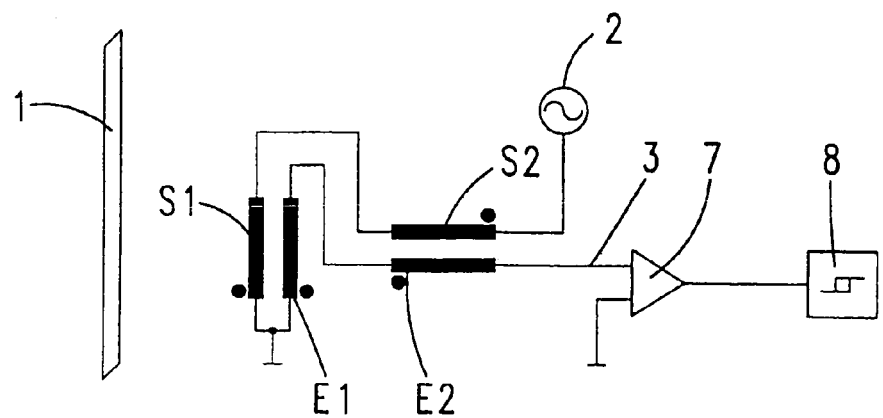
FIG. 9 shows a first example of a circuit and FIG. 10 shows a second example of a circuit.

FIG. 9 shows a first example of a circuit. Here, the two coils S1 and S2 are disposed with opposite winding directions. The coil S1 is connected in series with the coil S2. Both coils S1 and S2 are fed by an AC voltage generator 2, so that the transmitting coil S1 generates an alternating magnetic field which is capable of generating eddy currents in a sheet-metal trip 1. The second receiving coil E2, disposed on the same printed circuit board as the compensating coil S2, is connected in series with the first receiving coil E1 and both are wound in the same direction. The differential output signal of this receiving coil arrangement E1, E2 is fed to an amplifier 7. The output signal is passed on in a known way to a limit value switch 8. There, the switching signal is generated in a known way (see DE 40 31 252 C1). The differential voltage 3 is substantially proportional to the voltage generated in the receiving coil E1 by the eddy current field.

Figure 10:
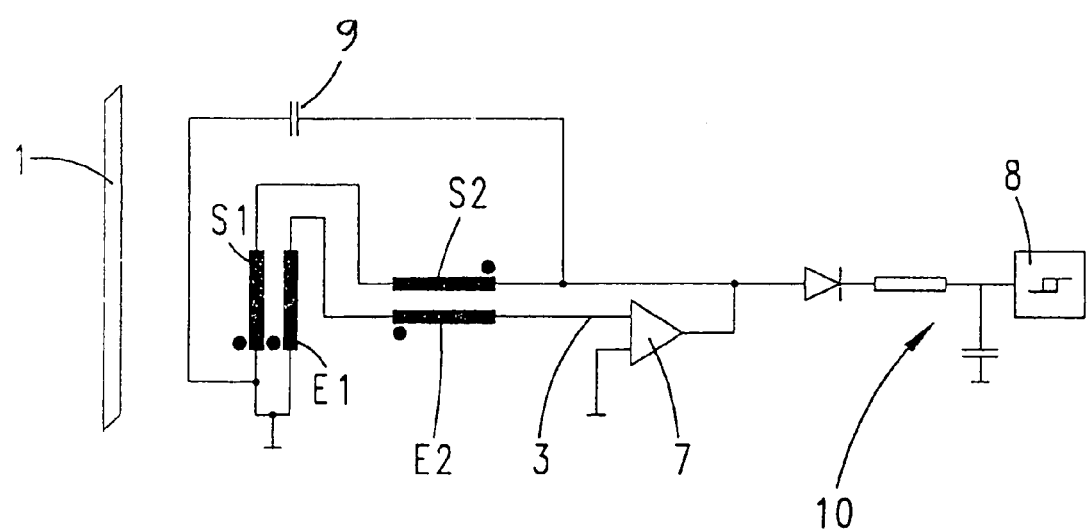

In the exemplary embodiment represented in FIG. 10, the two transmitting coils S1 and S2 form with a capacitor 9 an oscillating circuit. This is excited by the output signal of an amplifier 7. The input signal of the amplifier is the differential voltage signal at point 3 of the two receiving coils E1 and E2. The output signal of the amplifier is not only fed back into the oscillator, but passes via a lowpass filter 10 to a limit value switch, which supplies the output signal in a known way. The circuit represented in FIG. 10 can be set in such a way that the system oscillates whenever the trip 1 is far away. When the trip approaches, the transmitting field is weakened to such an extent that the oscillation breaks off. The reverse mode of operation is also possible. In the starting position, with the trip away, the system does not oscillate. Only when the trip approaches the transmitting coil S1 does it begin to oscillate.

The coil arrangement is not restricted just to the exemplary embodiments described above. Rather, it is also intended, and corresponds to the subject matter of the invention, that the individual coils S1, E1, S2 and E2 are also formed by multiple coil complexes, as are described for example by DE 10 057 773 A1. With regard to the configuration of multiple coils that can be used in this way, reference is also made to DE 10 057 773 for the purpose of disclosure.

The invention claimed is:

1. Inductive proximity switch with a pair of transmitting coils, having a first transmitting coil (S1) and a first receiving coil (E1) of a receiving coil arrangement, the first transmitting coil (S1) and the first receiving coil (E1) being disposed coaxially relative to each other, the transmitting coil (S1) transmitting an exciting field for inducing eddy currents in a metallic trip (1) brought into the vicinity of the proximity switch, which eddy currents generate a voltage-inducing eddy current field in the first receiving coil (E1) of the receiving coil arrangement, the first coil (E1) and a second coil (E2) of the receiving coil arrangement being disposed and connected in such a way that the exciting field generates a differential voltage (3) in the receiving coil arrangement, and wherein the proximity switch further comprises a pair of compensating coils including the second coil (E2) of the receiving coil arrangement and a compensating coil (S2) connected in series with the first transmitting coil (S1), the pair of compensating coils being disposed in such a way that they are virtually unable to be influenced by the eddy current field.

2. Inductive proximity switch according to claim 1, wherein a plane of the pair of transmitting coils formed by the first transmitting coil (S1) and the first receiving coil (E1) of the receiving coil arrangement lies at an angle greater than zero degrees, preferably perpendicular, to a plane of the pair of coils formed by the second coil (E2) of the receiving coil arrangement and the second compensating coil (S2).

3. Inductive proximity switch according to claim 1, wherein a spatial distancing of the two pairs of coils from one another provides that the eddy current field is considerably smaller in a region of the pair of compensating coils than in a region of the pair of transmitting coils.

4. Inductive proximity switch according to claim 1, further comprising a shielding of the pair of compensating coils.

5. Inductive proximity switch according to claim 1, wherein a plane of the transmitting coil (S1) or the first coil (E1) of the receiving coil arrangement lies at an angle greater than zero degrees, preferably perpendicular, to a plane of the second coil (E2) of the receiving coil arrangement or the second compensating coil (S2).

6. Inductive proximity switch according to claim 1, wherein the second coil (E2) of the receiving coil arrangement is disposed together with the compensating coil (S2) in such a way that they are virtually unable to be influenced by the eddy current field, for which purpose the first pair of coils, formed by the compensating coil (S2) and the second coil (E2) of the receiving coil arrangement, has a corresponding spatial distancing with respect to the second pair of coils, formed by the transmitting coil (S2) and the first coil (E1) of the receiving coil arrangement.

7. Proximity switch according to claim 6, wherein the two coils of a pair of coils are respectively disposed on two opposite sides of a printed circuit board (5, 6) coaxially next to one another or one above the other.

8. Inductive proximity switch according to claim 1, wherein the second coil (E2) of the receiving coil arrangement is disposed together with the compensating coil (S2) in such a way that they are virtually unable to be influenced by the eddy current field, for which purpose the first pair of coils, formed by the compensating coil (S2) and the second coil (E2) of the receiving coil arrangement, is shielded with respect to the second pair of coils, formed by the transmitting coil (S1) and the first coil (E1) of the receiving coil arrangement.

9. Proximity switch according to claim 1, wherein the second coil (E2) of the receiving coil arrangement and the compensating coil (S2) are disposed coaxially in relation to one another and close together, the first coil (E1) and the second coil (E2) of the receiving coil arrangement being similarly disposed.

10. Proximity switch according to claim 1, wherein that the transmitting coil (S1) and the first coil (E1) of the receiving coil arrangement have the same winding direction, and the second coil (E2) of the receiving coil arrangement and the compensating coil (S2) have opposite winding directions, or the transmitting coil (S1) and the first coil (E1) of the receiving coil arrangement have opposite winding directions, and the second coil (E2) of the receiving coil arrangement and the compensating coil (S2) have the same winding direction.

11. Proximity switch according to claim 1, wherein one of the two pairs of coils, the transmitting coil (S1) and the first coil (E1) of the receiving coil arrangement, or the second coil (E2) of the receiving coil arrangement and the compensating coil (S2), are formed as planar coils on a printed circuit board (5, 6).

12. Proximity switch according to claim 11, wherein the printed circuit board (6) carrying the compensating coil (S2) is connected to the rear side of the printed circuit board (5) carrying the transmitting coil (S1).

13. Proximity switch according to claim 11, wherein the printed circuit board (6) carrying the compensating coil is diametrically associated with the printed circuit board (5) carrying the transmitting coil.

14. Proximity switch according to claim 1, wherein the transmitting coil (S1), and the compensating coil (S2) are connected to a generator (2) oscillating with a fixed frequency and amplitude.

15. Proximity switch according to claim 1, wherein the transmitting coil (S1), and the compensating coil (S2) and the receiving coils (E1, E2) are components of a self-oscillating oscillator/generator (2) which is damped when the trip approaches, or begins to oscillate when the trip approaches.

* * * * *